(12) United States Patent
Meyer

(10) Patent No.: US 9,628,043 B2
(45) Date of Patent: Apr. 18, 2017

(54) DEVICE FOR EMC FILTERING ON A PRINTED CIRCUIT

(71) Applicant: EUROPEAN AERONAUTIC DEFENCE AND SPACE COMPANY EADS FRANCE, Paris (FR)

(72) Inventor: Marc Meyer, Launac (FR)

(73) Assignee: AIRBUS GROUP SAS, Blagnac (FR)

( * ) Notice: Subject to any disclaimer, the term of this patent is extended or adjusted under 35 U.S.C. 154(b) by 94 days.

(21) Appl. No.: 14/355,057

(22) PCT Filed: Oct. 30, 2012

(86) PCT No.: PCT/EP2012/071518
§ 371 (c)(1),
(2) Date: Apr. 29, 2014

(87) PCT Pub. No.: WO2013/064516
PCT Pub. Date: May 10, 2013

(65) Prior Publication Data
US 2014/0266505 A1    Sep. 18, 2014

(30) Foreign Application Priority Data

Nov. 4, 2011    (FR) ...................................... 11 60030

(51) Int. Cl.
*H03H 7/09*      (2006.01)
*H01F 27/24*     (2006.01)
(Continued)

(52) U.S. Cl.
CPC ............... *H03H 7/09* (2013.01); *H01F 19/04* (2013.01); *H01F 27/24* (2013.01); *H01F 27/28* (2013.01);
(Continued)

(58) Field of Classification Search
CPC   H03H 7/09; H01F 19/04; H01F 27/24; H01F 27/28; H01P 1/20345; H01P 1/23; H05K 1/0233
(Continued)

(56) References Cited

U.S. PATENT DOCUMENTS

2002/0057222 A1* 5/2002  McKinzie, III .......... H01Q 1/38
                                                       343/700 MS
2003/0137384 A1   7/2003  Itou et al.
(Continued)

FOREIGN PATENT DOCUMENTS

JP       2001267129 A    9/2001
WO    2008/048040 A1    4/2008

*Primary Examiner* — Stephen E Jones
*Assistant Examiner* — Scott S Outten
(74) *Attorney, Agent, or Firm* — IM IP Law; C. Andrew Im

(57) ABSTRACT

An EMC filtering device comprises a printed circuit comprising at least two parallel layers of a high-permittivity material, which are positioned between two layers of an insulating material that are parallel to one another and to the high-permittivity material layers. A core made of a magnetic material comprises three cylindrical arms passing perpendicularly through the high-permittivity and insulating material layers. At least two windings winding around the first arm of the magnetic material core, the windings and the first arm forming a first coil. At least two windings winding around the second arm of the magnetic material core, the windings and the second arm forming a second coil. The two coils being coupled coils.

11 Claims, 4 Drawing Sheets

(51) Int. Cl.
  *H01F 27/28*   (2006.01)
  *H01F 19/04*   (2006.01)
  *H01P 1/203*   (2006.01)
  *H01P 1/23*    (2006.01)
  *H01F 3/14*    (2006.01)
  *H05K 1/02*    (2006.01)
  *H05K 1/03*    (2006.01)
  *H05K 1/16*    (2006.01)

(52) U.S. Cl.
  CPC ............ *H01P 1/20345* (2013.01); *H01P 1/23* (2013.01); *H05K 1/0233* (2013.01); *H01F 3/14* (2013.01); *H01F 27/2804* (2013.01); *H05K 1/0231* (2013.01); *H05K 1/036* (2013.01); *H05K 1/162* (2013.01); *H05K 1/165* (2013.01); *H05K 2201/0195* (2013.01); *H05K 2201/086* (2013.01)

(58) Field of Classification Search
  USPC ........................................................ 333/185
  See application file for complete search history.

(56) References Cited

U.S. PATENT DOCUMENTS

| | | |
|---|---|---|
| 2007/0139151 A1* | 6/2007 | Nussbaum .......... H01F 17/0013 336/200 |
| 2007/0158105 A1 | 7/2007 | Kitao et al. |
| 2008/0238601 A1 | 10/2008 | Das et al. |
| 2009/0065954 A1* | 3/2009 | Sharma ................... H01L 23/66 257/784 |
| 2010/0003479 A1 | 1/2010 | Hwang et al. |

\* cited by examiner

DEVICE FOR EMC FILTERING ON A PRINTED CIRCUIT

RELATED APPLICATIONS

This application is a §371 application from PCT/EP2012/071518 filed Oct. 30, 2012, which claims priority from French Patent Application No. 11 60030 filed Nov. 4, 2011, each of which is herein incorporated by reference in its entirety.

TECHNICAL FIELD OF THE INVENTION

The invention relates to the electronics domain.

The invention more specifically relates to an EMC ("Electromagnetic Compatibility") filtering device on a printed circuit.

The applications of the invention are notably those of power electronics, specifically power converters, and those of analog and digital electronics.

PRIOR ART

The inflow of net semiconductor technologies has made it possible to work at high temperatures, reduce the size of heat dissipation elements, and raise switching frequencies.

The increase in switching frequencies has led to a deployment of the spectrum of conducted and radiated frequencies at higher frequencies.

Standards such as the DO160 standard in the aerospace sector, the CISPR25 standard in the automotive sector, and the MILSTD standard in the military sector, require conducted emissions to be below a threshold of 10 kilohertz to 100 megahertz, or 150 megahertz.

It is therefore necessary to produce filtering devices that reduce the spectrum of conducted and radiated emissions to below 100 megahertz. In addition, it is necessary to reduce the volume occupied by filtering devices and to reduce the parasitic elements of said filtering devices, as well as the inductance series created with the condensers and the capacitance created in parallel with the coils.

There are filtering devices, with a reduced volume, that make it possible to reduce the spectrum of conducted emissions to frequencies of between 10 megahertz and 100 megahertz, whose discreet filtering elements often underperform due to previously mentioned parasitic elements, while limiting the parasitic elements of the filtering elements.

FIGS. 1a, 2a show such a filtering device that makes it possible to limit the series creation of inductance with the condensers, and FIGS. 1b, 2b show a filtering device that does not make it possible limit the series creation of inductance with the condensers.

The filtering device shown in FIG. 1a comprises the conductive paths 101, 102 each comprising a via hole 103, 104 and a dielectric film 105 with a thickness between 8 micrometers and 32 micrometers interlayered between two copper metal electrodes with a thickness between 15 micrometers and 35 micrometers. The positioning of these elements 101-105 makes it possible to have an equivalent arrangement shown in FIG. 2a. This equivalent arrangement has two coils 110, 111 and a condenser 112 connected to the mass 113 that has a common core 120 with the two coils 110, 111.

The filtering device shown in FIG. 1b comprises a conductive path 106 comprising a via hole 107 and a dielectric film 105 with a thickness between 8 micrometers and 32 micrometers interlayered between two copper metal electrodes with a thickness between 15 micrometers and 35 micrometers. The positioning of these elements 105-107 makes it possible to have an equivalent arrangement shown in FIG. 2a. This equivalent arrangement has two coils 110, 111 and a condenser 112 connected to the mass 113 and in series with a coil 114 that has a common core 120 with the two coils 110, 111.

Comprising two conductive paths 101, 102 and two via holes 103, 104 instead of one conductive path 106 and one via hole 107, like the filtering device shown in FIG. 2a, the filtering device shown in FIG. 1a thus makes it possible to obtain a condenser 112 without series creating parasitic inductance 114 with the condenser 112. The capacitance of the condenser 112 depends on the permittivity and the thickness of the dielectric film 105. The thinner the dielectric film 105, the greater the capacitance of the condenser 112, the greater the permittivity of the dielectric film 105, and the greater the capacitance of the condenser 112.

FIG. 3 is a chart showing the current level |I| in decibel microamperes based on the frequency in Hertz. The current level |I| is measured with a spectrum analyzer and under normal test conditions. Curve 130 indicates the limit of the current level |I| based on the frequency imposed by the DO160 standard; curve 140 shows the current level |I| of a condenser for switching without a filtering device from FIG. 1a based on the frequency; and curve 150 shows the current level |I| of a condenser for switching with a filtering device from FIG. 1a based on the frequency. Curve 150 remains globally for the entire frequency range shown below curve 130, while curve 140 surpasses curve 130 starting at a frequency of 1 megahertz. The filtering device in FIG. 1a thus makes it possible to remain below the current level |I| limit imposed by the DO160 standard over a range of frequencies, while a simple passive filter makes it possible to reduce the first harmonic to 200 kilohertz.

However, integrating said filtering device into the integrated circuit does not make it possible to obtain the high inductance coils 110, 111.

To resolve this problem, there are filtering devices integrated into printed circuits comprising layers comprised of magnetic materials, but such devices are costly, difficult to manufacture, and unreliable.

There are also, for example by the scientific publication "Estimation des pertes cuivre dans des composants magnetiques planar—Application au LCT—LAI DAC Kien—JCGE '08 Lyon—16 et 17 décembre 2008" ["Estimation of copper losses in planar magnetic components—pplication to LCT—LAI DAC Kien—JCGE '08 Lyon—Dec. 16-17, 2008"], "planar" magnetic components comprising a transformer, coils, and condensers, integrated into a printed circuit comprising ferrite elements, for which the manufacture of the printed circuit is disassociated from the manufacture of the ferrite elements. However, the application of said magnetic components is not filtering, but rather a transformer.

PURPOSE OF THE INVENTION

The purpose of the invention is namely to propose an EMC filtering device that is reliable, easy to manufacture, and of a reduced volume, making it possible to lower the spectrum of conducted and radiated emissions to below 100 megahertz due to the reduction of parasitic elements of the filtering elements.

For this purpose, the invention relates to an EMC filtering device, characterized in that it comprises:

a printed circuit comprising at least two parallel layers of a high-permittivity material, which are positioned between two layers of an insulating material that are parallel to one another and to the layers of a high-permittivity material, a core made of a magnetic material comprising three cylindrical arms passing perpendicularly through the layers, at least two windings winding around the first arm of the magnetic material core, said windings and the first arm forming a first coil, at least two windings winding around the second arm of the magnetic material core, said windings and the second arm forming a second coil, the two coils being coupled coils.

According to one embodiment, the core made of a magnetic material comprises the three arms and two plates, each positioned at one end of the three arms, the layers each comprising three circular openings, such that when all of the layers are stacked, the circular openings form three cylindrical openings in which are positioned the three arms of the core.

According to one embodiment, the first winding of each coil is positioned on the top face of the first layer of a high-permittivity material, which is in contact with the first layer of an insulating material, the second winding of each coil is positioned on the bottom face of the second layer of high-permittivity material, which is in contact with the second layer of insulating material.

According to one embodiment, the windings of the two coils are flat.

According to one embodiment, the windings of the two coils are wound in the same direction, making it possible to create common coupled windings.

According to one embodiment, the windings of the first coil are wound in the opposite direction of the winding of the windings of the second coil, making it possible to create differential coupled coils.

According to one embodiment, the core made of a magnetic material comprises an air gap.

According to one embodiment, the layers of a high-permittivity material are made of a carbon material.

According to one embodiment, the core made of a magnetic material is made of ferrite.

According to one embodiment, the layers of dielectric material are made of a type FR4 material.

According to one embodiment, the printed circuit and the arms of the core are between one millimeter and three millimeters high.

BRIEF DESCRIPTION OF THE DRAWINGS

The invention will be better understood upon reading the following description and studying the figures that accompany it. These figures are provided for illustrative purposes only and are not limiting to the invention. They show.

Identical, similar, or analogous elements maintain the same reference from one figure to the next.

DESCRIPTION OF EXEMPLARY EMBODIMENTS OF THE INVENTION

Figure 1A:
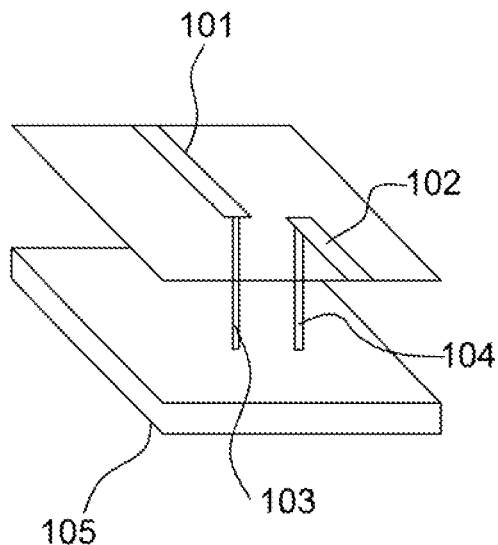
FIGS. 1a-1b (already described): schematic representations of filtering devices according to the prior art.
Figure 1B:
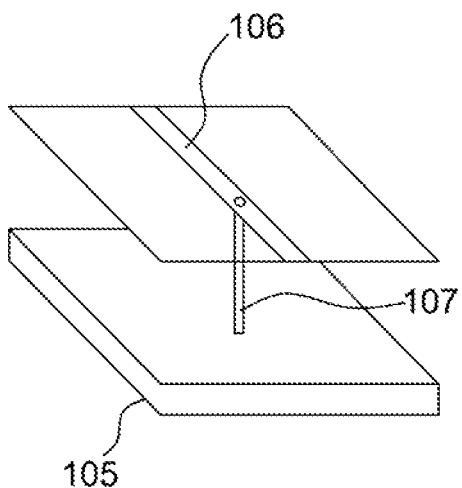
Figure 2A:
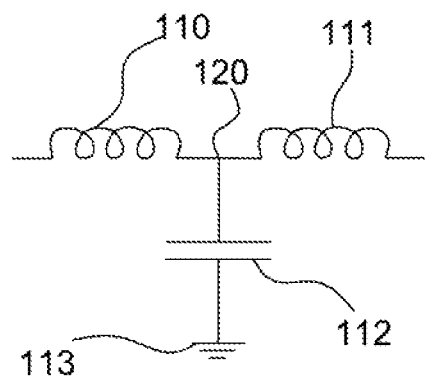
FIGS. 2a-2b (already described): schematic representations of filtering devices according to the prior art.
Figure 2B:
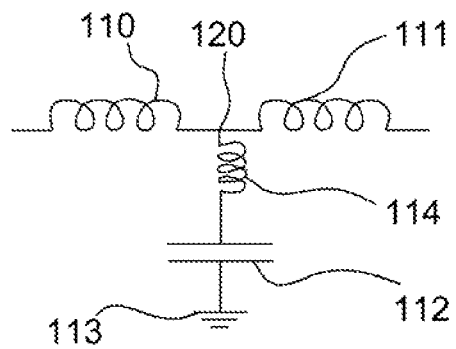
Figure 3:
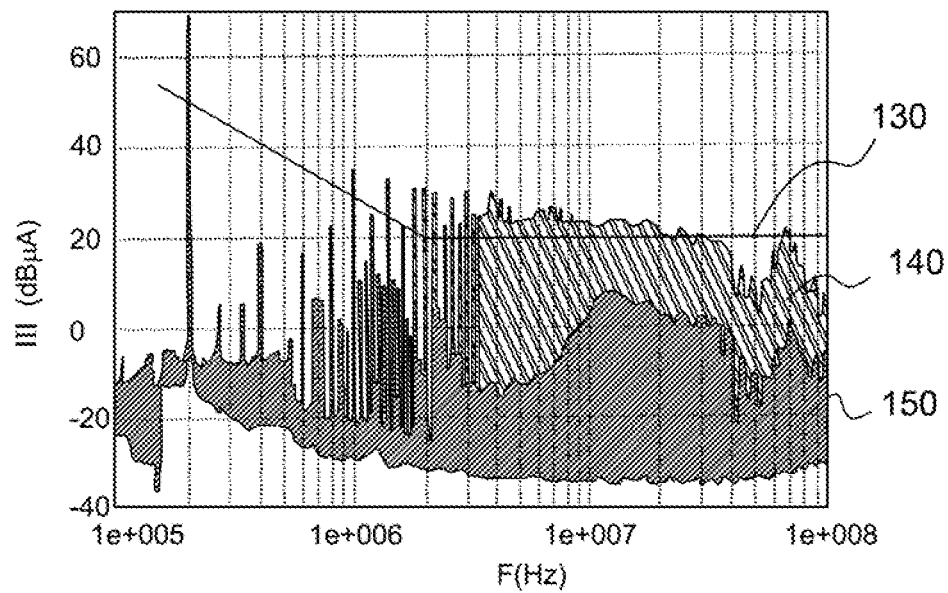
FIG. 3 (already described): a schematic representation of the current level |I| based on the frequency of a condenser for switching with a filtering device based on the prior art.
Figure 4:
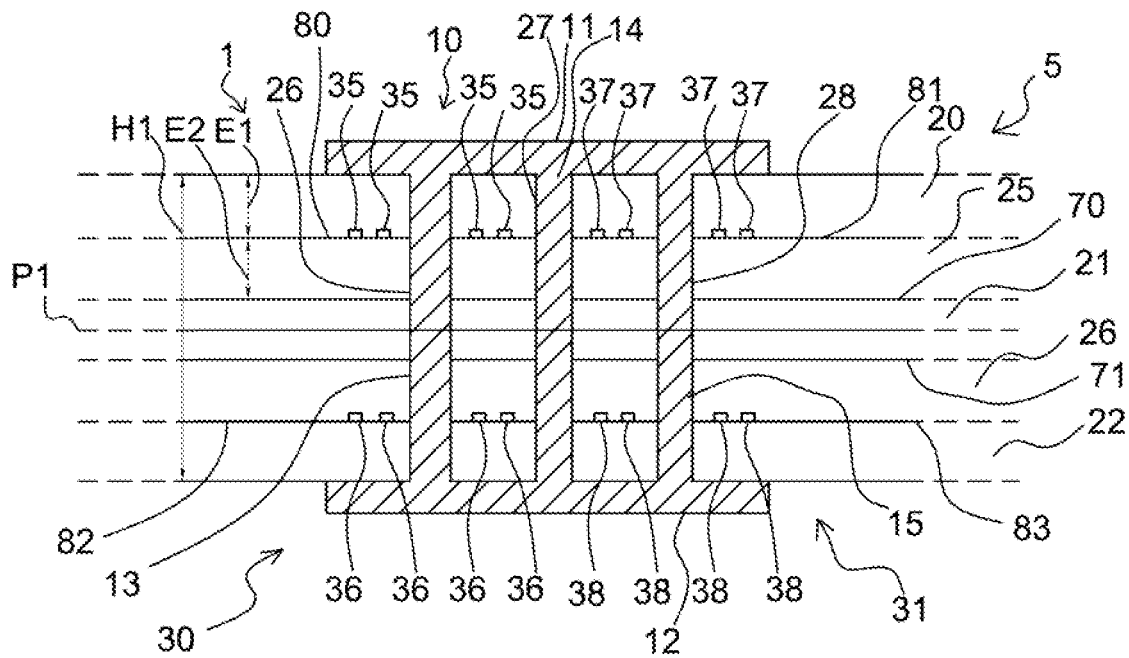
FIG. 4: a cross-sectional view of the filtering device according to the invention.

FIG. 4 shows an EMC filtering device 1 comprising a printed circuit 5 and a core 10 made of a magnetic material.

The printed circuit 5 comprises three parallel layers 20, 21, 22 of insulating material and two layers 25, 26 of a high-permittivity material, that are parallel to one another and to the layers 20, 21, 22.

More specifically, the layer 25 of high-permittivity material is positioned between the layers 20 and 21 of insulating material and the layer 26 of high-permittivity material is positioned between the layers 21 and 22 of insulating material.

More specifically, the layer 25 of high-permittivity material comprises on its top face, meaning the face that is in contact with the layer 20, a negative plane 80 and a positive plane 81 and comprises on its bottom face, meaning the face that is in contact with the layer 21, a mass plane 70. Similarly, the layer 26 of high-permittivity material comprises on its bottom face, meaning the face that is in contact with the layer 22, a positive plane 82 and a negative plane 83 and comprises on its top face, meaning the face that is in contact with the layer 21, a mass plane 71.

According to one embodiment, the printed circuit is of a height H1 between one millimeter and three millimeters. In one embodiment, the layers 20-22 are of a width E1 between 80 micrometers and 200 micrometers, and the layers 25, 26 are of a thickness E2 between 8 micrometers and 32 micrometers.

The structure of the printed circuit 5 is symmetrical relative to a plane P1 that is parallel to the layers 20, 21, 22, 25, 26 and passes through the middle of the height H1 of the printed circuit 5 to be compatible with the requirements for manufacturing the printed circuits 5, namely at the level of mechanical resistance.

In one embodiment, the layers 20, 21, 22, 25, 26 each comprise three circular openings, with a diameter D1 between two millimeters and a few centimeters, depending on the power of the equipment to be filters, such that when all of the layers 20, 21, 22, 25, 26 are stacked, the circular openings form three cylindrical openings 26, 27, 28 with a diameter D1 and a height H1.

The core 10 made of a magnetic material comprises two plane-parallel plates 11, 12 that are parallel to the layers 20, 21, 22, 25, 26 and three cylindrical arms 13, 14, 15 with a diameter D2 that is slightly less than D1 and with a height H1, such that the three arms 13, 14, 15 are positioned inside of the three cylindrical openings 26, 27, 28. The plate 11 is in contact with the top face of the layer 20 that is not in contact with the layer 25 and is bound to a first end of each arm 13-15. The plate 12 is in contact with the face of the layer 22 that is not in contact with the layer 26 and is bound to a second end of each arm 13-15.

The filtering device 1 further comprises two coupled coils 30, 31 each comprising two flat windings 35, 36, 37, 38 and having three arms 13, 14, 15 made from a magnetic material in common.

More specifically, the first winding 35 of the first coil 30 is positioned on the top face of the layer 25, meaning the face of the layer 25 that is in contact with the layer 20, and the second winding 36 of the first coil 30 is positioned on the bottom face of the layer 26, meaning the face of the layer 26 that is in contact with the layer 22. Similarly, the first winding 37 of the second coil 31 is positioned on the top face of the layer 25, meaning the face of the layer 25 that is in contact with the layer 20 and the second coiling 38 of the second coil 31 is positioned on the bottom face of the layer 26, meaning the face of the layer 26 that is in contact with the layer 22.

The windings 35, 36 wind around the arm 13 while the windings 37, 38 wrap around the arm 15.

Windings 35, 36, 37, 38 comprise a width between one millimeter and one centimeter. The number of windings of the windings 35, 36, 37, 38 varies between one winding and ten windings.

Figure 6A:
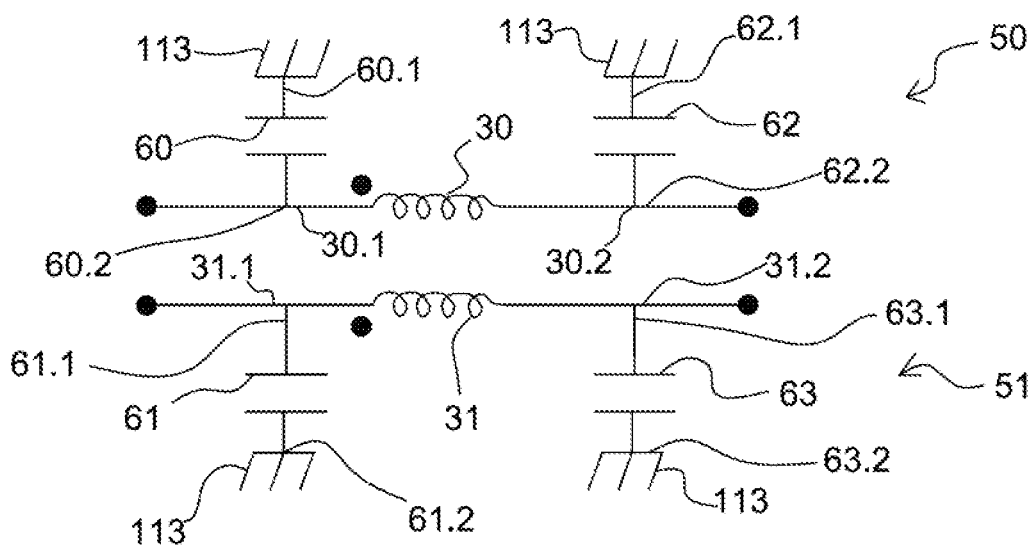
FIG. 6a-6b: schematic representations of the filtering device according to the invention and a variation of the filtering device according to the invention.
Figure 6B:
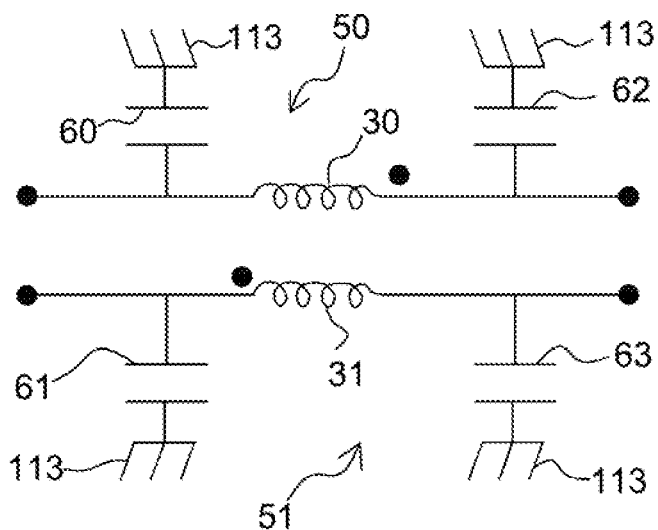

The positioning of the windings 35, 36, 37, 38 of the planes 70, 71, 80-83 and the layers 20-22, 25, 26 make it possible to obtain two "pi filtering" cells 50, 51, each comprising two condensers 60-63 and one coil 30, 31, as shown in FIGS. 6a-6b. The two coils 30, 31 are coupled.

More specifically, a first terminal 60.1 of the first condenser 60 of the first cell 50 is connected to the mass 113; a second terminal 60.2 of the first condenser 60 of the first cell 50 is connected to a first terminal 30.1 of the coil 30 of the first cell 50; a second terminal 30.2 of the coil 30 of the first cell 50 is connected to a first terminal 62.2 of the second condenser 62 of the first cell 50; and a second terminal 62.1 of the condenser 62 of the first cell 50 is connected to the mass 113. Similarly, a first terminal 61.2 of the first condenser 61 of the second cell 51 is connected to the mass 113; a second terminal 61.1 of the first condenser 61 of the second cell 51 is connected to a first terminal 31.1 of the coil 31 of the second cell 51; a second terminal 31.2 of the coil 31 of the second cell 51 is connected to a first terminal 63.1 of the second condenser 63 of the second cell 51; and a second terminal 63.2 of the condenser 63 of the second cell 51 is connected to the mass 113.

According to one embodiment, the inductance created by the filtering device 1 is a few microhenries.

Figure 5:
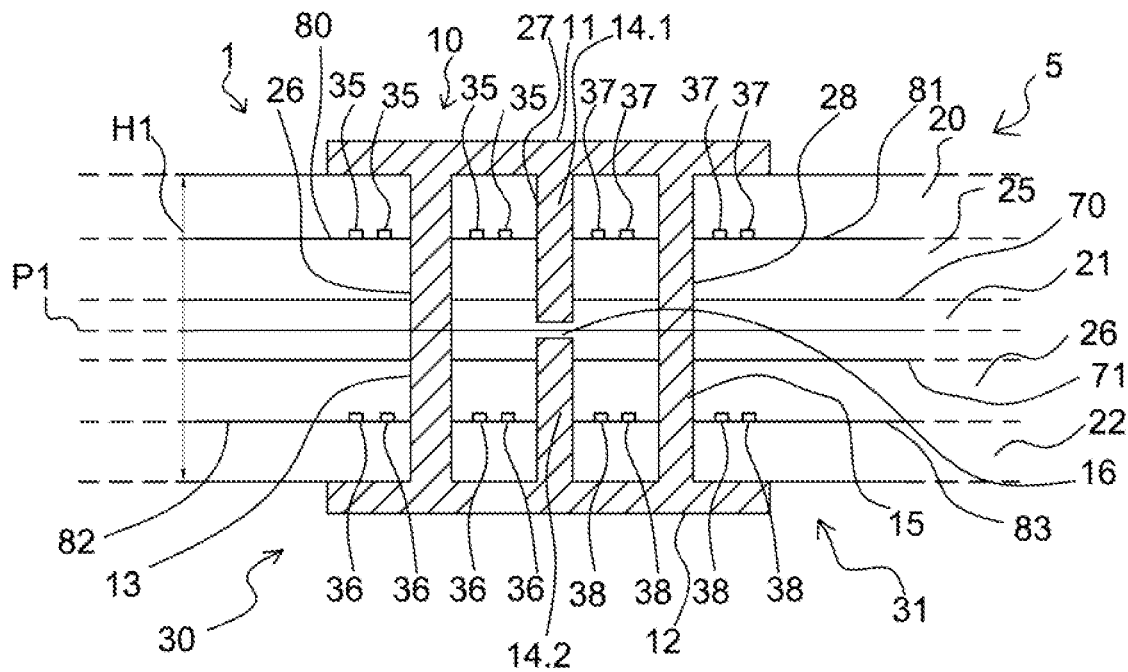
FIG. 5: a cross-sectional view of a variant of the filtering device according to the invention.

In a variant, as shown in FIG. 5, the structure 10 made of a magnetic material does not comprise an arm 14, but rather two arms 14.1, 14.2 with a diameter D2 positioned inside of the opening 27. The part of the opening 27 positioned between the two arms 14.1, 14.2 is called an air gap 16. Said air gap 16 makes it possible to prevent the saturation of the core 10 made of a magnetic material and to preserve a sufficient inductance to ensure the filtering. The thickness of the air gap 16 is between 100 micrometers and one millimeter.

The position of the windings 35, 36, 37, 38 relative to the mass planes 70, 71 make it position to reduce the capacitive couplings of the windings 30, 31 such that the filtering device 1 is effective over the highest range of frequencies of the spectrum of conducted and radiated emissions.

The windings 35, 36, 37, 38 are in the directions that make it possible to obtain two coupled coils 30, 31 in common mode and in differential mode. If the windings 35, 36 of the coil 30 and the windings 37, 38 of the coil 31 are wound in the same direction, for example in a clockwise direction, the two coupled coils 30, 31 are in common mode. If the windings 35, 36 of the coil 30 and the windings 37, 38 of the coil 31 are wound in opposite directions, for example the windings 35, 36 are wound in a clockwise direction and the windings 37, 38 are wound in a counterclockwise direction, the two coupled coils 30, 31 are in differential mode.

When the coupled coils 30, 31 are in common mode, the filtering device 1 filters the parasites in common mode. When the coupled coils 30, 31 are in differential mode, the filtering device 1 filters the parasites in differential mode.

Figure 7:
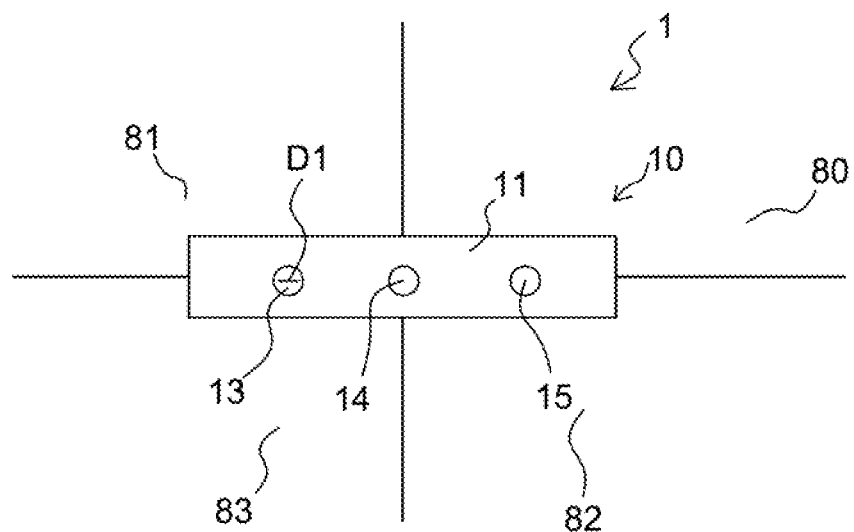
FIG. 7: a bottom view of the filtering device according to the invention.

FIG. 7 shows the filtering device 1 shown from above, when said filtering device is positioned between a power converter, next to the power supply and a LISN (Line Impedance Stabilization Network) or an electric distribution network. The disturbances present in the power converter are filtered in order to be below the threshold defined by the standards, by the filtering device 1, and therefore do not penetrate the LISN.

Planes 80, 81 are respectively positive and negative planes that are connected on the side of the power supply, and planes 82, 83 are respectively positive and negative planes that are connected to the LISN or to the electric distribution network. Planes 80-83 are positioned outside of the area delimited by the core 10.

The positioning of the planes 80-83 relative to the mass planes 70-71 make it possible to create a greater capacitance than the capacitance created by the positioning of the windings 35-38 relative to the mass planes 70, 71.

The printed circuit 5 of the filtering device 1 does not integrate magnetic material, which facilitates the manufacture of the printed circuit 5, reduces costs, and ensures reliability in accordance with industry requirements.

As a variant, the number of layers of insulating material and high-permittivity material is significant. The symmetry of the printed circuit 5 and the alternation between a layer of high-permittivity material and a layer of insulating material are respected.

As a variant, an additional layer of insulating material is interlayered between the layers 20, 25 and between the layers 26, 22. The windings 35, 37 are then positioned between the first additional layer of insulating material and the layer 30 and the windings 36, 38 are then positioned between the second additional layer of insulating material and the layer 22.

In one example, the layers 20-22 are made of FR4, the layers 25, 26 are made of carbon material, and the core 10 is made of ferrite. The relative permittivity $\epsilon_r$ of the carbon material is eight of 16.

The invention claimed is:

1. An EMC filtering device, comprising:
a printed circuit comprising at least two parallel layers of high-permittivity layers:
a first layer of high-permittivity material being positioned between a first layer of insulating material and a second layer of insulating material, the first layer of high-permittivity material comprising a negative side and a positive side on a face in contact with the first layer of insulating material and comprising a ground plane on a face in contact with the second layer of insulating material; and
a second layer of high-permittivity material being positioned between the second layer of insulating material and a third layer of insulating material, the second layer of high-permittivity material comprising a positive side and a negative side on a face in contact with the third layer of insulating material and comprising a ground plane on a face in contact with the second layer of insulating material;

a core made of a magnetic material comprising three cylindrical arms passing perpendicularly through the two layers of high-permittivity material and the three layers of insulating materials;

at least two windings around a first arm of the core made of a magnetic material, the windings and the first arm forming a first coil;

at least two windings around a second arm of the core made of a magnetic material, the windings and the second arm forming a second coil; and wherein the two coils are coupled coils.

2. The filtering device according to claim 1, wherein the core further comprises two plates, each positioned at one end of the three arms of the core; and wherein each of the layers of high-permittivity material and insulating material comprises three circular openings to form three cylindrical openings for positioning the three arms of the core when all of the layers are stacked together.

3. The filtering device according to claim 1, wherein a first winding of each coil is positioned on a top face of the first layer of high-permittivity material in contact with the first layer of insulating material; and wherein a second winding of each coil is positioned on a bottom face of the second layer of high-permittivity material in contact with the third layer of insulating material.

4. The filtering device according to claim 1, wherein the windings of the two coils are flat.

5. The filtering device according to claim 1, wherein the windings of the two coils are wound in a same direction to provide coupled coils in a common mode.

6. The filtering device according to claim 1, wherein the windings of the first coil are wound in a direction opposite of the windings of the second coil to provide coupled coils in a differential mode.

7. The filtering device according to claim 1, wherein the core made of a magnetic material comprises an air gap.

8. The filtering device according to claim 1, wherein the layers of high-permittivity material are made of a carbon material.

9. The filtering device according to claim 1, wherein the core made of a magnetic material is made of ferrite.

10. The filtering device according to claim 1, wherein the layers of insulating material are made of a FR4 type dielectric material.

11. The filtering device according to claim 1, wherein the printed circuit and the arms of the core are of a height between one millimeter and three millimeters.

* * * * *